US009502191B1

(12) United States Patent
Chen

(10) Patent No.: US 9,502,191 B1
(45) Date of Patent: Nov. 22, 2016

(54) LUMINOUS KEYBOARD

(71) Applicant: Primax Electronics Ltd., Neihu, Taipei (TW)

(72) Inventor: Chung-Yuan Chen, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 0 days.

(21) Appl. No.: 14/831,425

(22) Filed: Aug. 20, 2015

(30) Foreign Application Priority Data

Jul. 3, 2015 (TW) ............................. 104121674 A

(51) Int. Cl.
*H03K 17/96* (2006.01)
*H01H 13/83* (2006.01)
*H01H 13/7065* (2006.01)

(52) U.S. Cl.
CPC ......... *H01H 13/83* (2013.01); *H01H 13/7065* (2013.01); *H01H 2205/002* (2013.01); *H01H 2219/036* (2013.01)

(58) Field of Classification Search
CPC .. H01H 13/70; H01H 13/83; H01H 13/7065; H01H 2205/002; H01H 2219/036; G06F 3/02
See application file for complete search history.

(56) References Cited

U.S. PATENT DOCUMENTS

| | | | | |
|---|---|---|---|---|
| 7,530,723 B2 * | 5/2009 | Ohno | G02B 6/005 | 362/612 |
| 8,118,465 B2 * | 2/2012 | Kunimochi | G02B 6/0046 | 362/612 |
| 8,690,368 B1 * | 4/2014 | Shipman | H01H 13/83 | 362/23.03 |
| 9,035,806 B2 * | 5/2015 | Nishino | G06F 3/0202 | 200/314 |
| 2009/0128496 A1 * | 5/2009 | Huang | G06F 3/0202 | 345/170 |
| 2011/0120848 A1 * | 5/2011 | Su | H01H 13/83 | 200/5 A |
| 2011/0272262 A1 * | 11/2011 | Chen | H01H 13/83 | 200/5 A |
| 2013/0044506 A1 * | 2/2013 | Chen | H01H 13/83 | 362/556 |

* cited by examiner

*Primary Examiner* — Anabel Ton
(74) *Attorney, Agent, or Firm* — Kirton McConkie; Evan R. Witt

(57) ABSTRACT

A luminous keyboard includes a keypad module, plural light-emitting elements, an illumination circuit board and a light guide plate. The illumination circuit board has a light amount control structure. When the light beams from the light-emitting elements are transmitted through the illumination circuit board, portions of the light beams are absorbed by the light amount control structure on the illumination circuit board. Consequently, the light amount of the light beams transmitted through the illumination circuit board is reduced. The luminous keyboard can effectively overcome the light leakage problem.

10 Claims, 5 Drawing Sheets

LUMINOUS KEYBOARD

FIELD OF THE INVENTION

The present invention relates to a keyboard, and more particularly to a luminous keyboard with an illuminating function.

BACKGROUND OF THE INVENTION

Generally, the widely-used peripheral input device of a computer system includes for example a mouse device, a keyboard, a trackball device, or the like. Via the keyboard, characters and symbols can be inputted into the computer system directly. As a consequence, most users and most manufacturers of input devices pay much attention to the development of keyboards.

FIG. 1 is a schematic top view illustrating the outer appearance of a conventional keyboard. As shown in FIG. 1, there are plural keys 10 on a surface of the conventional keyboard 1. These keys 10 are classified into several types, e.g. ordinary keys 101, numeric keys 102 and function keys 103. When one of these keys 10 is depressed by the user's finger, a corresponding signal is issued to the computer, and thus the computer executes a function corresponding to the depressed key. For example, when an ordinary key 101 is depressed, a corresponding English letter or symbol is inputted into the computer. When a numeric key 102 is depressed, a corresponding number is inputted into the computer. In addition, the function keys 103 (F1~F12) can be programmed to provide various functions. For example, the conventional keyboard 1 is a keyboard for a notebook computer.

With the maturity of the computing technologies, the keyboard manufacturers make efforts in designing novel keyboards with special functions in order to meet diversified requirements of different users. For this reason, luminous keyboards are favored by users. The outer appearance of the conventional luminous keyboard is substantially similar to the outer appearance of the conventional keyboard 1. Since the luminous keyboard provides the function of illuminating the keys, the inner structure of the luminous keyboard is different from the inner structure of the keyboard without the illuminating function. Hereinafter, the inner structure of the luminous keyboard will be illustrated in more details. FIG. 2 is a schematic cross-sectional view illustrating a conventional luminous keyboard. As shown in FIG. 2, the conventional luminous keyboard 2 comprises plural keys 20, a membrane switch circuit member 21, a light guide plate 22, a backlight module 23, a supporting plate 24 and a reflecting plate 25. Each key 20 comprises a keycap 201, a scissors-type connecting element 202 and an elastic element 203. From top to bottom, the keycap 201, the scissors-type connecting element 202, the elastic element 203, the membrane switch circuit member 21, the supporting plate 24, the light guide plate 22 and the reflecting plate 25 of the conventional luminous keyboard 2 are sequentially shown. The backlight module 23 is located at a side of the membrane switch circuit member 22. For example, the conventional luminous keyboard 2 is a keyboard for a notebook computer (not shown).

In the key 20, the keycap 201 is exposed outside the conventional luminous keyboard 2, so that the keycap 201 can be depressed by the user. The scissors-type connecting element 202 is used for connecting the keycap 201 and the supporting plate 24. The elastic element 203 is penetrated through the scissors-type connecting element 202. In addition, both ends of the elastic element 203 are contacted with the keycap 201 and the membrane switch circuit member 21, respectively. The membrane switch circuit member 21 comprises an upper wiring board 211, a spacer layer 212, and a lower wiring board 213. The upper wiring board 211, the spacer layer 212 and the lower wiring board 213 are all made of a light-transmissible material. The light-transmissible material is for example polycarbonate (PC) or polyethylene (PE). The upper wiring board 211 has plural upper contacts 2111. The spacer layer 212 is disposed under the upper wiring board 211, and comprises plural perforations 2121 corresponding to the plural upper contacts 2111. The lower wiring board 213 is disposed under the spacer layer 212, and comprises plural lower contacts 2131 corresponding to the plural upper contacts 2111. The plural lower contacts 2131 and the plural upper contacts 2111 are collectively defined as plural key switches 214.

The backlight module 23 comprises an illumination circuit board 231 and plural light-emitting elements 232. For clarification and brevity, only two light-emitting elements 232 are shown in the drawing. The illumination circuit board 231 is disposed under the membrane switch circuit member 21 for providing electric power to the plural light-emitting elements 232. The plural light-emitting elements 232 are disposed on the illumination circuit board 231. In addition, the plural light-emitting elements 232 are inserted into plural reflecting plate openings 251 of the reflecting plate 25 and plural light guide plate openings 221 of the light guide plate 22, respectively. By acquiring the electric power, the plural light-emitting elements 232 are driven to emit plural light beams B. Moreover, the plural light beams B are introduced into the light guide plate 22. For example, the plural light-emitting elements 232 are side-view light emitting diodes. The plural light beams B are subjected to total internal reflection within the light guide plate 22, and thus the plural light beams B are guided to the keycaps 201 by the light guide plate 22. As shown in FIG. 2, the supporting plate 24 is arranged between the membrane switch circuit member 21 and the light guide plate 22 for supporting the keycap 201, the scissors-type connecting element 202, the elastic element 203 and the membrane switch circuit member 21. The reflecting plate 25 is disposed under the light guide plate 22 for reflecting the plural light beams B. Consequently, the plural light beams B are directed upwardly, and the utilization efficiency of the light beams B is enhanced.

In the conventional luminous keyboard 2, each keycap 201 has a light-outputting zone 2011. The light-outputting zone 2011 is located at a character region or a symbol region of the keycap 201. Moreover, the position of the light-outputting zone 2011 is aligned with the position of a corresponding light-guiding dot 223 of the light guide plate 22. The light beams B can be guided upwardly to the light-outputting zone 2011 by the corresponding light-guiding dot 223. The supporting plate 24 comprises plural supporting plate openings 241. The plural supporting plate openings 241 are aligned with corresponding light-guiding dots 223 and corresponding light-outputting zones 2011. On the other hand, since the membrane switch circuit member 21 is made of the light-transmissible material, the plural light beams B can be transmitted through the membrane switch circuit member 21. Consequently, after the plural light beams B are guided by the light-guiding dots 223, the plural light beams B are sequentially transmitted through the plural supporting plate openings 241 and the membrane switch circuit member 21 and directed to the plural light-outputting zones 2011, thereby illuminating the character region or the symbol region of the keycap 201. Under this circumstance, the illuminating function is achieved.

While the plural light beams B from the light-emitting elements 232 are projected to the light guide plate 22, the plural light beams B are radiated from the light-emitting elements 232. Consequently, portions of the plural light beams B are introduced into the light guide plate 22 at a larger incident angle and unable to be subjected to total internal reflection within the light guide plate 22. The portions of the plural light beams B unable to be subjected to total internal reflection are transferred downwardly through the illumination circuit board 231. Consequently, the light beams are leaked out from the illumination circuit board 231. Meanwhile, a light leakage problem occurs.

Therefore, there is a need of providing a luminous keyboard for overcoming the light leakage problem.

SUMMARY OF THE INVENTION

An object of the present invention provides a luminous keyboard for overcoming the light leakage problem.

In accordance with an aspect of the present invention, there is provided a luminous keyboard. The luminous keyboard includes a keypad module, at least one light-emitting element, an illumination circuit board and a light guide plate. The keypad module is exposed to a top surface of the luminous keyboard. The at least one light-emitting element is disposed under the keypad module, and emits at least one light beam. The illumination circuit board is disposed under the keypad module, and supports the at least one light-emitting element. The light guide plate is disposed under the keypad module. The at least one light beam is subjected to total internal reflection within the light guide plate and guided to the keypad module by the light guide plate. The illumination circuit board has a light amount control structure. The light amount control structure is disposed on a bottom surface of the illumination circuit board. When the at least one light beam is transmitted through the illumination circuit board, a light amount of the at least one light beam transmitted through the illumination circuit board is reduced by the light amount control structure.

From the above descriptions, the present invention provides a luminous keyboard. The luminous keyboard has an illumination circuit board with a special structure. In particular, a light amount control structure is disposed on a bottom surface of the illumination circuit board. When light beams are projected to the illumination circuit board and the light amount of the light beams is very strong to transmit through the illumination circuit board, portions of the light beams are absorbed by the light amount control structure that is disposed on the bottom surface of the illumination circuit board. Consequently, the light amount of the light beams to be transmitted through the illumination circuit board is reduced. In another embodiment, a second light amount control structure is disposed on the top surface of the illumination circuit board. Since light amount of the light beams to be transmitted through the illumination circuit board is reduced, the light leakage problem is effectively overcome.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

For overcoming the drawbacks of the conventional luminous keyboard, the present invention provides an improved luminous keyboard.

Figure 1:
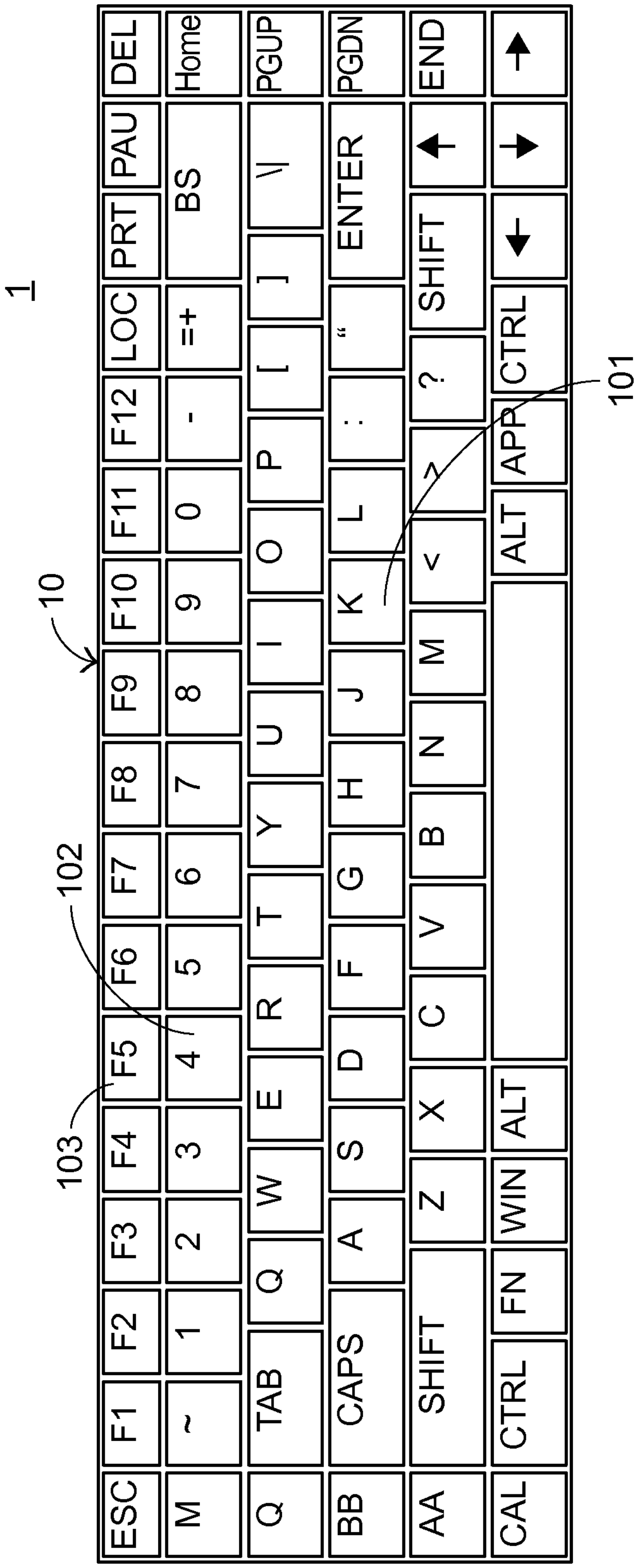
FIG.1 PRIOR ART
FIG. 1 is a schematic top view illustrating the outer appearance of a conventional keyboard.
Figure 2:
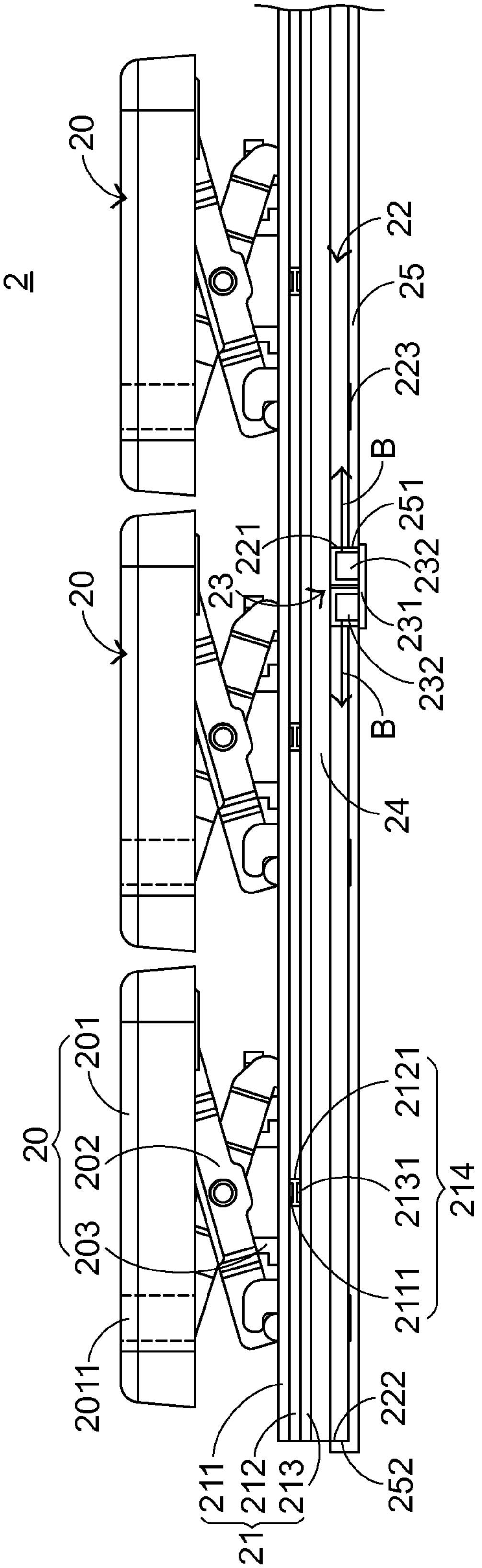
FIG.2 PRIOR ART
FIG. 2 is a schematic cross-sectional view illustrating a conventional luminous keyboard.
Figure 3:
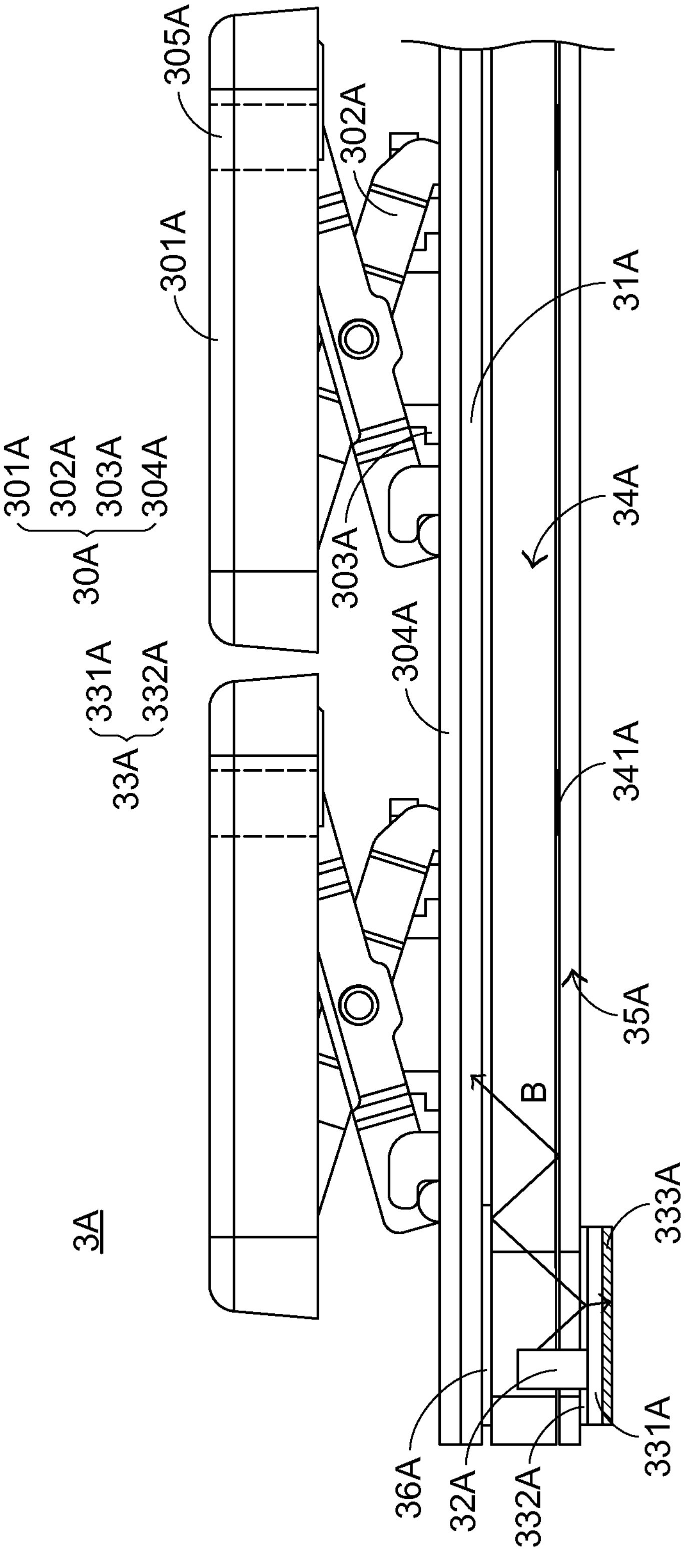
FIG. 3 is a schematic cross-sectional view illustrating the structure of a luminous keyboard according to a first embodiment of the present invention.

First of all, the structure of the luminous keyboard of the present invention will be illustrated as follows. FIG. 3 is a schematic cross-sectional view illustrating the structure of a luminous keyboard according to a first embodiment of the present invention. As shown in FIG. 3, the luminous keyboard 3A comprises a keypad module 30A, a supporting plate 31A, plural light-emitting elements 32A, an illumination circuit board 33A, a light guide plate 34A, a reflecting plate 35A and a light-shading plate 36A. For clarification and brevity, only one light-emitting element 32A is shown in the drawing. The keypad module 30A is exposed to a top surface of the luminous keyboard 3A. The keypad module 30A comprises plural keycaps 301A, plural connecting elements 302A, plural elastic elements 303A and a switch circuit member 304A. Each of the plural keycaps 301A, the corresponding connecting element 302A and the corresponding elastic element 303A are collaboratively defined as a key. Each keycap 301A has a light-outputting zone 305A. The plural keycaps 301A are exposed to the top surface of the luminous keyboard 3A, so that the keycaps 301A can be depressed by the user. The connecting elements 302A are used for connecting the corresponding keycaps 301A and the supporting plate 31A and allowing the keycaps 301A to be moved upwardly or downwardly relative to the supporting plate 31A. The elastic elements 303A are penetrated through the corresponding connecting elements 302A, and contacted with the corresponding keycaps 301A and the switch circuit member 304A. The switch circuit member 304A is disposed under the plural keys. When the switch circuit member 304A is triggered by the plural elastic elements 303A, plural key signals are correspondingly generated. The structure of the switch circuit member 304A is similar to that of the conventional membrane switch circuit member, and is not redundantly described herein. It is noted that the switch circuit member 304A is not limited to the membrane switch circuit member.

In this embodiment, the connecting element 302A is a scissors-type connecting element, and the elastic element 303A is a rubbery elastomer. Preferably but are not exclusively, the plural keycaps 301A of the plural keys are moved upwardly or downwardly with the connecting elements 302A, and the switch circuit member 304A is depressed by the plural elastic elements 303A through the plural keys. In another embodiment, the connecting elements are non-scissors connecting element for controlling movements of the keys. In a further embodiment, the keycaps are moved upwardly or downwardly in response to magnetic forces.

Please refer to FIG. 3 again. The plural light-emitting elements 32A are disposed on the illumination circuit board

33A, and disposed under the keypad module 30A. Moreover, the plural light-emitting elements 32A are partially inserted into the light guide plate 34A. The plural light-emitting elements 32A are used for emitting plural light beams B, and the plural light beams B are laterally introduced into the light guide plate 34A. The illumination circuit board 33A is disposed under the keypad module 30A, and the plural light-emitting elements 32A are supported on the illumination circuit board 33A. The illumination circuit board 33A comprises a circuit board main body 331A, a protective layer 332A and a light amount control structure 333A. The circuit board main body 331A is electrically connected with the plural light-emitting elements 32A, and the plural light-emitting elements 32A are supported on the circuit board main body 331A. The light amount control structure 333A is disposed on a bottom surface of the circuit board main body 331A. The light amount control structure 333A is used for absorbing portions of the plural light beams B, so that the light amount of the light beams B transmitted through the circuit board main body 331A is reduced. The protective layer 332A is disposed on a top surface of the circuit board main body 331A for protecting electrical contacts (not shown) of the circuit board main body 331A. In this embodiment, the plural light-emitting elements 32A are side-view light emitting diodes, and the illumination circuit board 33A is a flexible printed circuit (FPC). The circuit board main body 331A is formed by combining polyimide (PI) and copper foil together. The protective layer 332A is made of a transparent material.

The light guide plate 34A is disposed under the keypad module 30A. The plural light beams B are subjected to total internal reflection within the light guide plate 34A, and thus the plural light beams B are guided to the keypad module 30A by the light guide plate 34A. The light guide plate 34A comprises plural light-guiding structures 341A. Each light-guiding structure 341A is aligned with the corresponding light-outputting zone 305A. The plural light beams B can be guided to the corresponding light-outputting zones 305A by the light-guiding structures 341A so as to illuminate the corresponding keys.

The reflecting plate 35A is disposed under the light guide plate 34A. The portions of the plural light beams B that are not subjected to total internal reflection within the light guide plate 34A can be reflected by the reflecting plate 35A. Consequently, the utilization efficiency of the portions of the plural light beams B that are not subjected to total internal reflection will be enhanced. The light-shading plate 36A is disposed over the light guide plate 34A and the plural light-emitting elements 32A. By means of the light-shading plate 36A, the portions of the plural light beams B that are not subjected to total internal reflection within the light guide plate 34A will not be directly projected to the keypad module 30A. In an embodiment, the light-guiding structure 341A is a one of a light-guiding microstructure, a light-guiding dot, a light-guiding ink and a light-guiding texturing structure.

In this embodiment, the light amount control structure 333A is made of a light absorption material, and the light amount control structure 333A is attached on a bottom surface of the circuit board main body 331A. The light amount control structure 333A is used for absorbing portions of the plural light beams B, so that the light amount of the light beams B transmitted through the circuit board main body 331A is reduced. Consequently, the light leakage problem is diminished or avoided. In an embodiment, the light absorption material is a composite material of a high refractive index material and a low refractive index material, wherein the low refractive index material is covered by the high refractive index material. Alternatively, the light absorption material is selected from a surface plasmon material or a metamaterial. The examples of the light absorption material are presented herein for purpose of illustration and description only. In another embodiment, the light absorption material is formed on the bottom surface of the circuit board main body by a depositing process, a printing process or a transfer printing process, so that the light amount control structure is produced.

The operating principles of depressing the keycaps 301A of the luminous keyboard 3A to generate the key signals are well known to those skilled in the art, and are not redundantly described herein. The illumination of the luminous keyboard 3A will be illustrated as follows. Please refer to FIG. 3 again. When the plural light-emitting elements 32A emit the plural light beams B, portions of the light beams B are laterally introduced into the light guide plate 34A and subjected to total internal reflection within the light guide plate 34A. The light beams B can be guided to the corresponding light-outputting zones 305A by the light-guiding structures 341A so as to illuminate the light-outputting zones 305A. On the other hand, other portions of the plural light beams B at a larger incident angle are projected on the illumination circuit board 33A, and transferred to the light amount control structure 333A through the protective layer 332A and the circuit board main body 331A sequentially. Meanwhile, since the light beams B are absorbed by the light amount control structure 333A, the light leakage problem is eliminated.

Figure 4:
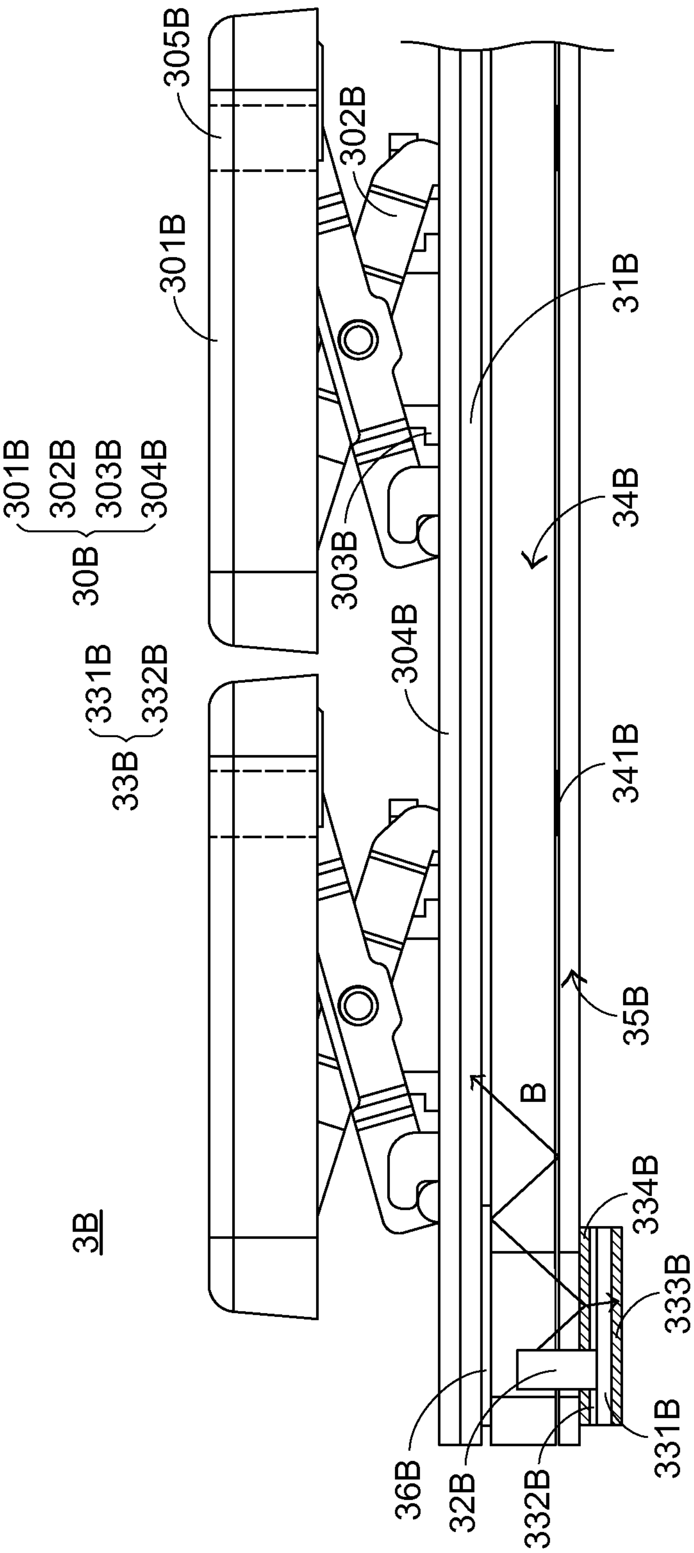
FIG. 4 is a schematic cross-sectional view illustrating the structure of a luminous keyboard according to a second embodiment of the present invention.

The present invention further provides a luminous keyboard of a second embodiment, which is distinguished from the above embodiment. FIG. 4 is a schematic cross-sectional view illustrating the structure of a luminous keyboard according to a second embodiment of the present invention. As shown in FIG. 4, the luminous keyboard 3B comprises a keypad module 30B, a supporting plate 31B, plural light-emitting elements 32B, an illumination circuit board 33B, a light guide plate 34B and a reflecting plate 35B. For clarification and brevity, only one light-emitting element 32B is shown in the drawing. The keypad module 30B comprises plural keycaps 301B, plural connecting elements 302B, plural elastic elements 303B and a switch circuit member 304B. Each keycap 301B has a light-outputting zone 305B. The light guide plate 34B comprises plural light-guiding structures 341B. Each light-guiding structure 341B is aligned with the corresponding light-outputting zone 305B. The illumination circuit board 33B comprises a circuit board main body 331B, a protective layer 332B, a first light amount control structure 333B and a second light amount control structure 334B. The components of the luminous keyboard 3B of this embodiment which are similar to the luminous keyboard 3A of the first embodiment are not redundantly described herein. In comparison with the first embodiment, the illumination circuit board 33B of the luminous keyboard 3B of this embodiment further comprises the second light amount control structure 334B.

As shown in FIG. 4, the second light amount control structure 334B is disposed on a top surface of the protective layer 332B. By the second light amount control structure 334B, the light amount of the light beams B to be transmitted through the protective layer 332B and the circuit board main body 331B is reduced. In this embodiment, the second light amount control structure 334B is also made of a light absorption material, and the second light amount control structure 334B is attached on a top surface of the protective layer 332B. It is noted that numerous modifications and alterations may be made while retaining the teachings of the invention. For example, in another embodiment, the light absorption material is deposited, printed or transfer-printed on the top surface of the protective layer, so that the second light amount control structure is produced.

In this embodiment, the luminous keyboard 3B is further equipped with the second light amount control structure 334B. When the light beams B are projected to the illumination circuit board 33B, the light beams B are firstly transferred through the second light amount control structure 334B and partially absorbed by the second light amount control structure 334B for a first time. Consequently, less amount of the light beams B is transmitted through the protective layer 332B and the circuit board main body 331B. Then, the light beams B are partially absorbed by the first light amount control structure 333B for a second time. The operations of the first light amount control structure are similar to those of the first embodiment, and are not redundantly described herein. Since the light amount of the light beams B transmitted through the illumination circuit board 33B is reduced, the light leakage problem of the luminous keyboard 3B can be effectively overcome.

Figure 5:
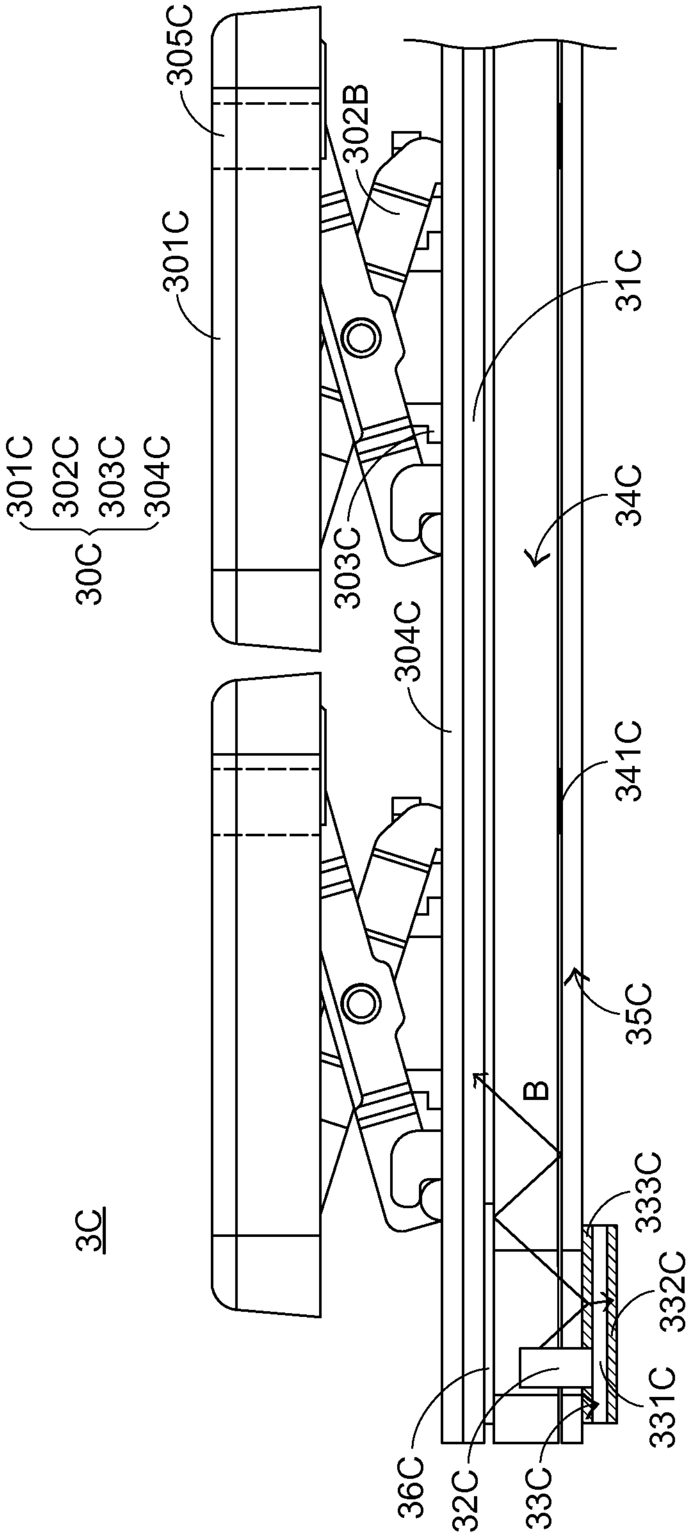
FIG. 5 is a schematic cross-sectional view illustrating the structure of a luminous keyboard according to a third embodiment of the present invention.

The present invention further provides a luminous keyboard of a third embodiment, which is distinguished from the above embodiments. FIG. 5 is a schematic cross-sectional view illustrating the structure of a luminous keyboard according to a third embodiment of the present invention. As shown in FIG. 5, the luminous keyboard 3C comprises a keypad module 30C, a supporting plate 31C, plural light-emitting elements 32C, an illumination circuit board 33C, a light guide plate 34C, a reflecting plate 35C and a light-shading plate 36C. For clarification and brevity, only one light-emitting element 32C is shown in the drawing. The keypad module 30C comprises plural keycaps 301C, plural connecting elements 302C, plural elastic elements 303C and a switch circuit member 304C. Each keycap 301C has a light-outputting zone 305C. The light guide plate 34C comprises plural light-guiding structures 341C. Each light-guiding structure 341C is aligned with the corresponding light-outputting zone 305C. The components of the luminous keyboard 3C of this embodiment which are similar to the luminous keyboard 3A of the first embodiment are not redundantly described herein. In comparison with the first embodiment, the structure of the illumination circuit board 33C of the luminous keyboard 3C of this embodiment is distinguished.

The illumination circuit board 33C comprises a circuit board main body 331C, a first light amount control structure 332C and a second light amount control structure 333C. The first light amount control structure 332C is disposed on a bottom surface of the circuit board main body 331C. The first light amount control structure 332C is used for absorbing portions of the plural light beams B, so that the light amount of the light beams B transmitted through the circuit board main body 331C is reduced. The second light amount control structure 333C is disposed on a top surface of the circuit board main body 331C for protecting electrical contacts (not shown) of the circuit board main body 331C. Moreover, the second light amount control structure 333C is exposed to a region between the plural light-emitting elements 32C and the light guide plate 34C. The second light amount control structure 333C is used for absorbing portions of the light beams B, so that less amount of the light beams B is transmitted through the circuit board main body 331C. In this embodiment, the second light amount control structure 333C is also made of a light absorption material, and the second light amount control structure 333C is attached or deposited on a top surface of the circuit board main body 331C. In other words, the second light amount control structure 333C is able to replace the protective layer, and has the functions of protecting the electrical contacts and reducing the light amount of the light beams to be transmitted through the illumination circuit board.

The operating principle of depressing the keycaps 301C of the luminous keyboard 3C and the illumination of the luminous keyboard 3C are similar to those of the luminous keyboard 3A of the first embodiment, and are not redundantly described herein. In the luminous keyboard 3C of this embodiment, the protective layer is replaced by the second light amount control structure 333C. Since the protective layer is omitted, the thickness of the illumination circuit board 33C is reduced. Moreover, since the luminous keyboard 3C is not equipped with the protective layer, the fabricating cost is reduced.

From the above descriptions, the present invention provides a luminous keyboard. The luminous keyboard has an illumination circuit board with a special structure. In particular, a light amount control structure is disposed on a bottom surface of the illumination circuit board. When light beams are projected to the illumination circuit board and the light amount of the light beams is very strong to transmit through the illumination circuit board, portions of the light beams are absorbed by the light amount control structure that is disposed on the bottom surface of the illumination circuit board. Consequently, the light amount of the light beams to be transmitted through the illumination circuit board is reduced. In another embodiment, a second light amount control structure is disposed on the top surface of the illumination circuit board. Since light amount of the light beams to be transmitted through the illumination circuit board is reduced, the light leakage problem is effectively overcome.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all modifications and similar structures.

What is claimed is:

1. A luminous keyboard, comprising:

a keypad module exposed to a top surface of the luminous keyboard;

at least one light-emitting element disposed under the keypad module, and emitting at least one light beam;

an illumination circuit board disposed under the keypad module, and supporting the at least one light-emitting element; and a light guide plate disposed under the keypad module, wherein the at least one light beam is subjected to total internal reflection within the light guide plate and guided to the keypad module by the light guide plate, wherein the illumination circuit board has a light amount control structure, and the light amount control structure is disposed on a bottom surface of the illumination circuit board, wherein when the at least one light beam is transmitted through the illumination circuit board, a light amount of the at least one light beam transmitted through the illumination circuit board is reduced by the light amount control structure, wherein the light amount control structure is made of a light absorption material, and the light amount control structure is attached, printed, transfer-printed or deposited on a bottom surface of the circuit board main body.

2. The luminous keyboard according to claim 1, wherein the illumination circuit board further comprises:

a circuit board main body electrically connected with the at least one light-emitting element, wherein the at least one light-emitting element is supported on the circuit board main body; and a protective layer disposed on a top surface of the circuit board main body to protect the circuit board main body.

3. The luminous keyboard according to claim 2, wherein the illumination circuit board further comprises an additional light amount control structure, and the additional light amount control structure is formed on the top surface of the circuit board main body, wherein the additional light amount control structure is arranged between the circuit board main body and the light guide plate, and exposed to a region between the at least one light-emitting element and the light guide plate, wherein the additional light amount control structure absorbs a portion of the at least one light beam, so that the light amount of the at least one light beam transmitted through the illumination circuit board is reduced, wherein the additional light amount control structure is made of a light absorption material, and the additional light amount control structure is attached, printed, transfer-printed or deposited on the top surface of the circuit board main body.

4. A luminous keyboard, comprising:

a keypad module exposed to a top surface of the luminous keyboard;

at least one light-emitting element disposed under the keypad module, and emitting at least one light beam;

an illumination circuit board disposed under the keypad module, and supporting the at least one light-emitting element; and a light guide plate disposed under the keypad module, wherein the at least one light beam is subjected to total internal reflection within the light guide plate and guided to the keypad module by the light guide plate, wherein the illumination circuit board has a light amount control structure, and the light amount control structure is disposed on a bottom surface of the illumination circuit board wherein when the at least one light beam is transmitted through the illumination circuit board, a light amount of the at least one light beam is transmitted through the illumination circuit board is reduced by the light amount control structure, wherein the illumination circuit board further comprises:

a circuit board main body electrically connected with the at least one light-emitting element, wherein the at least one light-emitting element is supported on the circuit board main body; and an additional light amount control structure disposed on a top surface of the circuit board main body, wherein the circuit board main body is protected by the additional light amount control structure, and the light amount of the at least one light beam transmitted through the illumination circuit board is reduced by the additional light amount control structure.

5. The luminous keyboard according to claim 4, wherein the light amount control structure is made of a light absorption material, and the light amount control structure is attached, printed, transfer-printed or deposited on a bottom surface of the circuit board main body.

6. The luminous keyboard according to claim 4, wherein the additional light amount control structure is arranged between the circuit board main body and the light guide plate, and exposed to a region between the at least one light-emitting element and the light guide plate, wherein the additional light amount control structure absorbs a portion of the at least one light beam, so that the light amount of the at least one light beam transmitted through the illumination circuit board is reduced, wherein the additional light amount control structure is made of a light absorption material, and the additional light amount control structure is attached, printed, transfer-printed or deposited on the top surface of the circuit board main body.

7. The luminous keyboard according to claim 1, wherein the at least one light-emitting element and the illumination circuit board are upright, wherein the illumination circuit board is disposed under the light guide plate, and the at least one light-emitting element is inserted into a lower portion of the light guide plate.

8. The luminous keyboard according to claim 1, wherein the luminous keyboard further comprises a supporting plate under the keypad module, and the keypad module is supported on the supporting plate, wherein the keypad module comprises:

plural keys exposed to the top surface of the luminous keyboard, wherein each of the plural keys comprises:

a keycap exposed to the top surface of the luminous keyboard, wherein the keycap comprises a light-outputting zone, wherein after the at least one light beam is guided by the light guide plate, the at least one light beam is transmitted through the light-outputting zone;

a connecting element arranged between the supporting plate and the keycap, wherein by the connecting element, the supporting plate and the keycap are connected with each other, and the keycap is movable upwardly and downwardly relative to the supporting plate; and an elastic element disposed under the keycap, and providing an elastic force to the keycap, wherein the keycap is returned to an original position in response to the elastic force; and a switch circuit member disposed under the plural keys, wherein when the switch circuit member is triggered by the plural keys, the switch circuit member generates corresponding key signals.

9. The luminous keyboard according to claim 4, wherein the at least one light-emitting element and the illumination circuit board are upright, wherein the illumination circuit board is disposed under the light guide plate, and the at least one light-emitting element is inserted into a lower portion of the light guide plate.

10. The luminous keyboard according to claim 4, wherein the luminous keyboard further comprises a supporting plate under the keypad module, and the keypad module is supported on the supporting plate, wherein the keypad module comprises:

plural keys exposed to the top surface of the luminous keyboard, wherein each of the plural keys comprises:

a keycap exposed to the top surface of the luminous keyboard, wherein the keycap comprises a light-outputting zone, wherein after the at least one light beam is guided by the light guide plate, the at least one light beam is transmitted through the light-outputting zone;

a connecting element arranged between the supporting plate and the keycap, wherein by the connecting element, the supporting plate and the keycap are connected with each other, and the keycap is movable upwardly and downwardly relative to the supporting plate; and an elastic element disposed under the keycap, and providing an elastic force to the keycap, wherein the keycap is returned to an original position in response to the elastic force; and a switch circuit member disposed under the plural keys, wherein when the switch circuit member is triggered by the plural keys, the switch circuit member generates corresponding key signals.

* * * * *